United States Patent
Simpson et al.

(10) Patent No.: US 10,247,780 B2
(45) Date of Patent: Apr. 2, 2019

(54) RE-PROGRAMMABLE SELF-TEST

(71) Applicant: TEXAS INSTRUMENTS INCORPORATED, Dallas, TX (US)

(72) Inventors: Neil John Simpson, Rockwall, TX (US); Alan David Hales, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/666,789

(22) Filed: Aug. 2, 2017

(65) Prior Publication Data
US 2019/0041459 A1 Feb. 7, 2019

(51) Int. Cl.
*G01R 31/28* (2006.01)
*G01R 31/3187* (2006.01)
*G01R 31/3183* (2006.01)
*G01R 31/317* (2006.01)
*G11C 29/12* (2006.01)
*G11C 29/36* (2006.01)

(52) U.S. Cl.
CPC ..... *G01R 31/3187* (2013.01); *G01R 31/3183* (2013.01); *G01R 31/31724* (2013.01); *G01R 31/318335* (2013.01); *G01R 31/318385* (2013.01); *G11C 29/12* (2013.01); *G11C 2029/3602* (2013.01)

(58) Field of Classification Search
CPC ............ G11C 29/12; G11C 2029/3602; G01R 31/3183; G01R 31/3187; G01R 31/318385; G01R 31/31724; G01R 31/318335

USPC .......................... 714/726, 727, 728
See application file for complete search history.

(56) References Cited

U.S. PATENT DOCUMENTS

| | | | | |
|---|---|---|---|---|
| 5,572,712 A | * | 11/1996 | Jamal | G06F 11/267 714/733 |
| 7,603,603 B2 | * | 10/2009 | Dubey | G11C 29/003 324/750.3 |
| 2011/0029813 A1 | * | 2/2011 | Gunderson | G06F 11/27 714/30 |
| 2011/0238878 A1 | * | 9/2011 | Welguisz | G06F 13/24 710/262 |
| 2011/0239070 A1 | * | 9/2011 | Morrison | G06F 11/2236 714/731 |
| 2011/0307750 A1 | * | 12/2011 | Narayanan | G01R 31/31854 714/729 |
| 2014/0082453 A1 | * | 3/2014 | Sikdar | G11C 29/808 714/763 |
| 2017/0363685 A1 | * | 12/2017 | Douskey | G01R 31/31723 |

* cited by examiner

*Primary Examiner* — Albert Decady
*Assistant Examiner* — Osman M Alshack
(74) *Attorney, Agent, or Firm* — Kenneth Liu; Charles A. Brill; Frank D. Cimino

(57) ABSTRACT

The PRPG provides the test stimulus to the circuit, but it can only generate a finite number of care-bits from any given input seed which limits the maximum coverage that can be achieved. The only way to increase the coverage is to provide additional seed input data to the PRPG. The on-chip one time only programmable eFuse is used to store new PRPG seed data inputs and corresponding MISR output signature data for comparison. An XOR circuit option on the output of the MISR is operable to further compress the output data.

19 Claims, 3 Drawing Sheets

RE-PROGRAMMABLE SELF-TEST

TECHNICAL FIELD OF THE INVENTION

The technical field of this invention is built in self-test.

BACKGROUND OF THE INVENTION

Today's Systems on a Chip (SoC) have very high level of integration with multiple voltage regulators, voltage monitors, analog to digital and digital to analog converters, power on reset controllers and other systems which significantly increase the scope and complexity of manufacturing test coverage as well as the cost of testing.

During its lifetime, a digital system is tested and diagnosed on numerous occasions. For the system to perform its intended mission with high availability, testing and diagnosis must be quick and effective. A sensible way to ensure this is to specify test as one of the system functions—in other words, self-test.

Digital systems involve a hierarchy of parts: chips, boards, cabinets, and so on. At the highest level, which may include the entire system, the operation is controlled by software. Self-test is often implemented in software. While a purely software approach to self-test may suffice at the system level, it has several disadvantages. Such testing may have poor diagnostic resolution because it must test parts designed without specific testability considerations. In addition, a good software test can be very long, slow, and expensive to develop.

An attractive alternative is built-in self-test, (BIST) that is, self-test implemented in hardware.

The basic BIST architecture requires the addition of three hardware modules to a digital circuit: a pattern generator; a response analyzer; and a test controller.

Examples of pattern generators are a ROM with stored patterns, a counter, or a linear feedback shift register (LFSR). A typical response analyzer is a comparator with stored responses or a signature analyzer. The signature analyzer may be implemented in a number of ways known in the art, with the most common being a Multiple Input Shift Register (MISR).

A control module is usually required to activate the test and analyze the responses.

SUMMARY OF THE INVENTION

Self-test solutions have been well known for many years, but they have always been limited by the fixed nature of the coverage that can be achieved. Including the re-programmability option shown in this invention through employing a one time programmable eFuse for the Pseudo Random Pattern Generator (PRPG) seed data input and the Multiple Input Shift Register (MISR) signature output comparison, provides an enhanced capability to increase the coverage of the self-test solution after manufacture.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
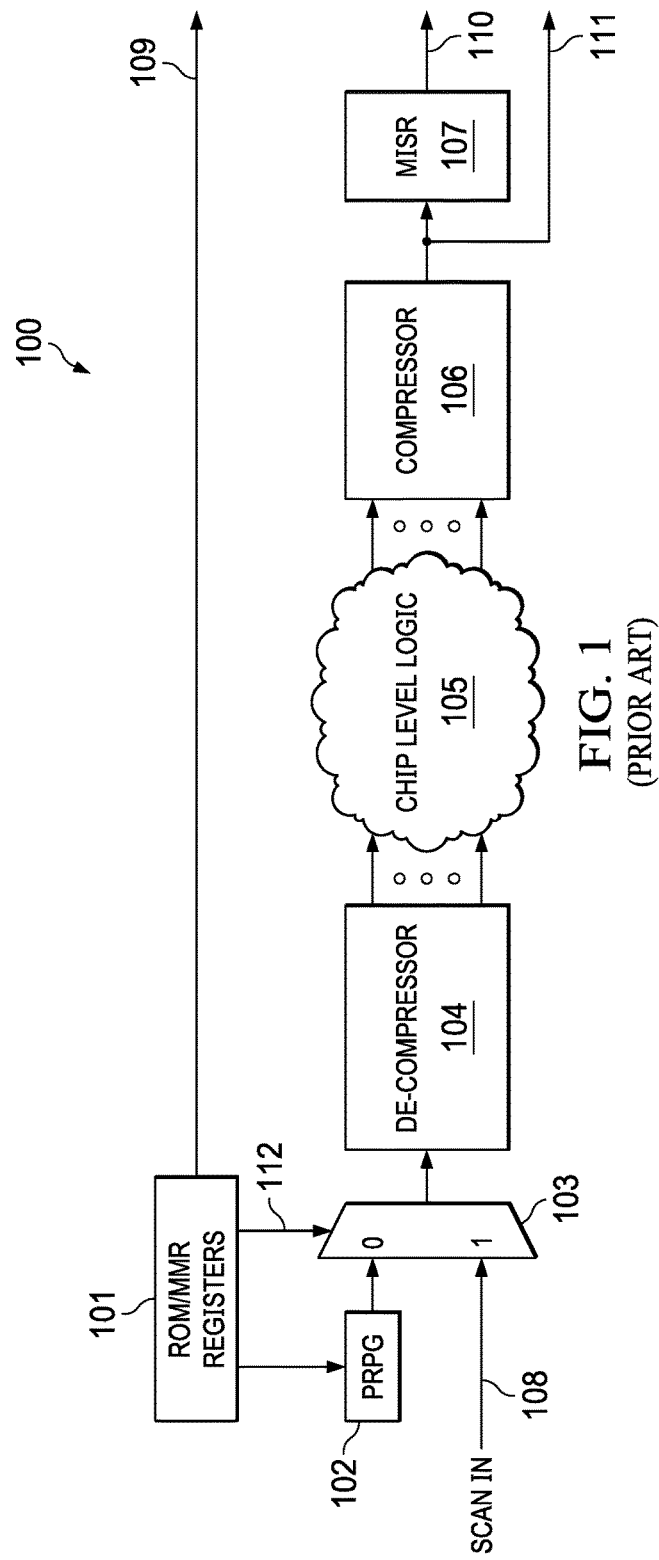
FIG. 1 shows a BIST circuit as implemented in the prior art.

FIG. 1 shows an implementation of a BIST circuit as known in the prior art. Test patterns are generated by a PRPG 102 that may be implemented in various ways known in the art, but usually as an LFSR that generates a pseudo random sequence starting from a given initial seed. Seeds for the PRPG 102 and the corresponding MISR signatures are stored in read only memory/memory mapped register file 101. The seeds are provided to PRPG 102. The output of PRPG 102 is connected to a first input of selector 103. Selector 103 is operable to select either the output of PRPG 102, or an external scan input signal 108, dependent upon the state of control signal 112. The output of selector 103 is connected to de-compressor/expander 104. This module expands the input pattern using several possible, symmetrical methods known in the art such as a Linear Feedback Shift Register (LFSR), and connects the expanded output to the circuit under test 105. The resulting output of circuit under test 105 is connected to compressor 106 which compresses the output data using the reverse of the method that was used in de-compressor/expander 104, typically using an LFSR. The output of compressor 106 is provided to optional external test equipment on scan output line 111, and to the input of MISR module 107. The output of MISR module 107 is the signature of the test result. This result is provided to an external comparator via line 110, to be compared to the expected output provided from module 101 on line 109. Depending on the implementation, compressor 106 and MISR module 107 may be combined into one circuit module.

Figure 2:
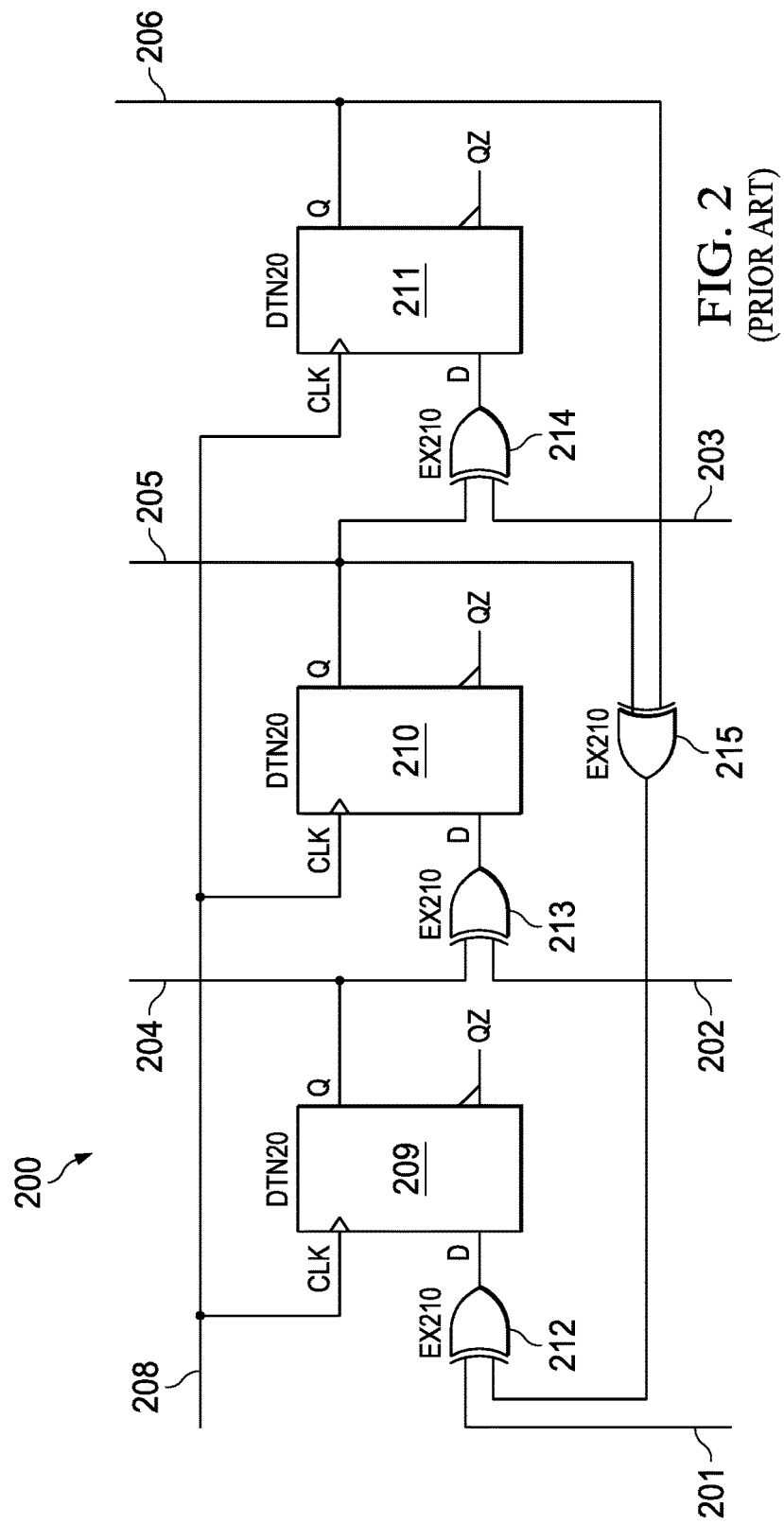
FIG. 2 shows a MISR circuit of the prior art.

FIG. 2 shows an exemplary implementation of a 3 stage LFSR. This is well known in the art, and may be used in the PRPG 102, MISR module 107, decompressor/expander 104 and compressor 106.

As shown in 200, the LFSR consists of a plurality of flip/flop register circuits 209, 210 and 211, and feedback gates 212, 213, 214 and 215. The number of flip/flop circuit stages in an implementation is dependent on the application. If the application is a PRPG, the number of stages determines the length of the pseudo random sequence before repeating. In this application, the seed, or starting point of the sequence is input on lines 201, 202 and 203 to respective XOR gates 212, 213 and 214. When the LFSR is clocked on line 208, a new member of the pseudo random sequence is output on lines 204, 205 and 206 on every clock transition.

If the application is decompression or expansion, the initial pattern is input to XOR gates 212, 213 and 214, and the output from lines 204, 205 and 206 are used as the test stimulus to the circuit under test. For each pattern input, the LFSR is clocked a plurality of times thus generating a plurality of test patterns based on each instance of the input pattern. In this application, the number of stages is dependent upon the number of test stimuli needed for the particular circuit being tested.

The compressor and MISR functions may be combined in one function, and are essentially the reverse of the de-compressor function, with the same number of stages as the compressor. The signature representing the results of the test is recovered after the same number of clock transitions in the compressor as was employed in the de-compressor.

Figure 3:
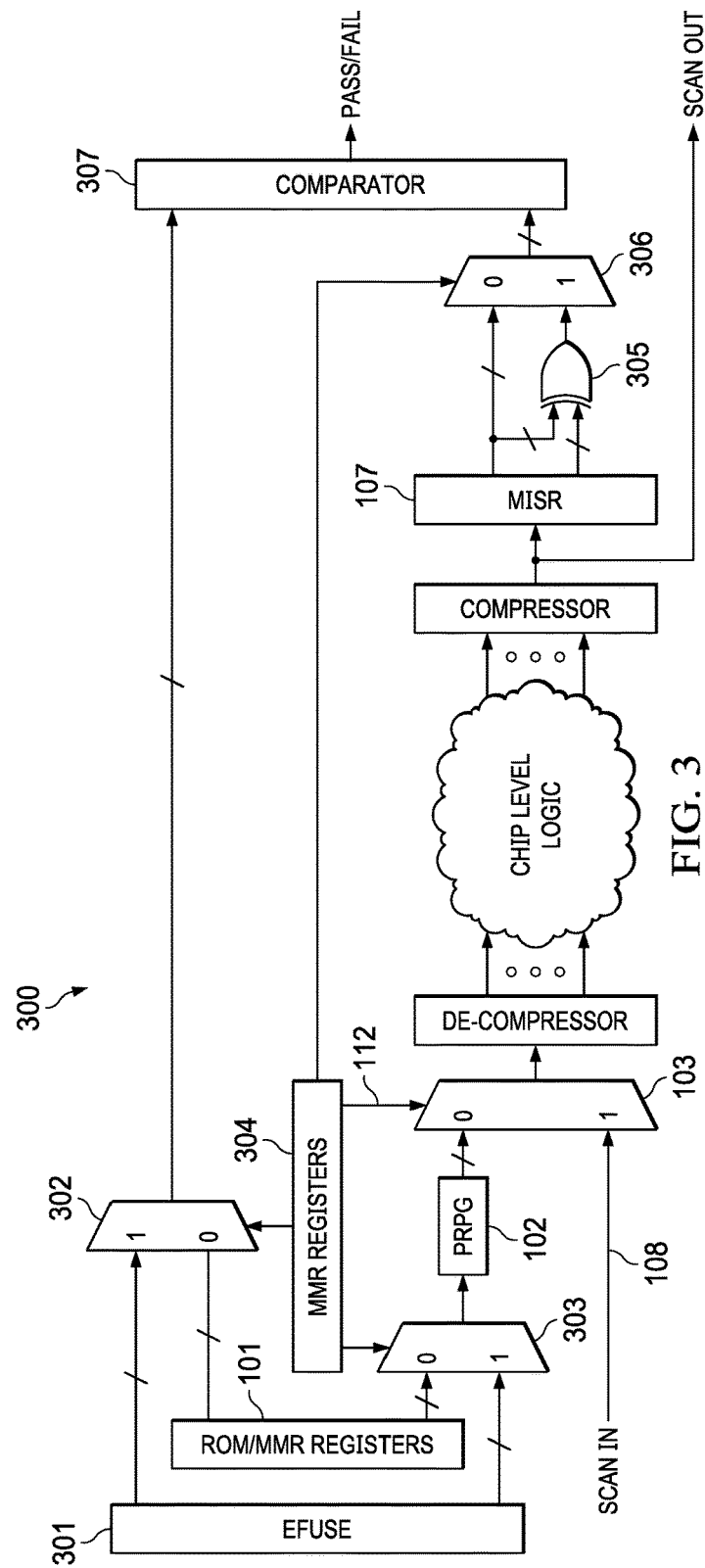
FIG. 3 shows the BIST circuit of this invention.

FIG. 3 shows the BIST circuit of the invention. The eFuse module 301 is one time programmable to hold additional seed values for the PRPG 102 and additional expected signature data corresponding to the new seeds. A first output of eFuse module 301 is connected to a first input of selector 303 to provide seed data stored in eFuse module 301 to the selector 303. A second input of selector 303 is connected to the seed output port of ROM/register bank 101. The control input of selector 303 is connected to an output from MMR control register bank 304, and the output of selector 303 is connected to PRPG 102. Selector 303 thus controls the source of the seed being used by PRPG 102. MMR control register bank 304 controls selectors 302, 303 and 306.

The first output of MISR module 107 is connected to the first input of selector 306, and to the first input of XOR module 305. The second output of MISR module 107 is connected to the second input of XOR module 305. The output of XOR module 305 is connected to the second input of selector 306. Selector 306 is controlled by an output from MMR control register bank 304 and is operable to select whether the output of selector 306 is the signature from MISR module 107, or is a further modified signature from XOR module 305. XOR module 305 further compresses the signature by masking off non-applicable parts of the signature.

The output of selector 306 is connected to a first input of comparator 307. A second input of comparator 307 is connected the output of selector 302. The output of comparator 307 is the pass/fail indication of the BIST.

The first input of selector 302 is connected to a second output of eFuse 301, and the second input of selector 302 is connected to the second (signature) output port of ROM/Register bank 101. Selector 302 thus, depending on the state of the control signal from MMR control register bank 304 selects whether the signature input to comparator 307 originates from the eFuse module 301, or from the ROM/Register module 101.

It is understood that while certain embodiments are described herein by way of example, many modifications and other embodiments will come to the mind of one skilled in the art having the benefit of the teachings presented in the foregoing description and the associated drawings. Accordingly, it is understood that various modifications and embodiments are intended to be included within the scope of the appended claims.

What is claimed is:

1. A built-in-self-test (BIST) apparatus comprising:
a first memory to store a first set of seed values and a first set of expected signature values that correspond to the first set of seed values;
a second memory to store a second set of seed values and a second set of expected signature values that correspond to the second set of seed values;
a first selection circuit having a first input coupled to the first memory, a second input coupled to the second memory, a third input to receive a first control signal, and an output to output a selected one of a seed value from the first set of seed values or a seed value from the second set of seed values as a selected seed value in response to the first control signal;
a second selection circuit having a first input coupled to the first memory, a second input coupled to the second memory, a third input to receive a second control signal, and an output to output a selected one of an expected signature value from the first set of signatures values or an expected signature value from the second set of signature values as a selected expected signature value in response to the second control signal;
a pseudo-random pattern generator (PRPG) to generate a plurality of test patterns based on the selected seed value and having an output to output the plurality of test patterns;
decompression logic having an input to receive the test patterns from the PRPG and an output to output expanded test patterns corresponding to the test patterns from the PRPG;
a multiple input shift register (MISR) having an input to receive, from a circuit under test, a response based on the expanded test patterns, a first output, and a second output, wherein the first output of the MISR represents a signature value of the response;
an XOR logic circuit having a first input coupled to the first output of the MISR, a second input coupled to the second output of the MISR, and an output, wherein the output of the XOR logic circuit represents a modified signature value of the response;
a third selection circuit having a first input coupled to the first output of the MISR to receive the signature value, a second input coupled to the output of the XOR logic circuit to receive the modified signature value, a third input to receive a third control signal, and an output to output a selected one of the signature value or the modified signature value as a selected signature value in response to the third control signal; and
a comparator having a first input to receive the selected expected signature value, a second input to receive the selected signature value, and an output to output a result of comparing the selected expected signature value and the selected signature value.

2. The BIST apparatus of claim 1, wherein the XOR logic circuit is configured to mask a portion of the signature value to produce the modified signature value.

3. The BIST apparatus of claim 1, comprising control logic to provide the first control signal, the second control signal, and the third control signal.

4. The BIST apparatus of claim 1, comprising:
a scan input to receive a scan signal; and
a fourth selection circuit having a first input coupled to the output of the PRPG to receive the test patterns, a second input coupled to the scan input to receive the scan signal, a third input to receive a fourth control signal, an output to output a selected one of the test patterns or the scan signal in response to the fourth control signal.

5. The BIST apparatus of claim 1, wherein:
the first memory includes a memory mapped register file; and
the second memory includes a one-time programmable (OTP) memory.

6. The BIST apparatus of claim 5, wherein the OTP memory includes an electronic fuse device (eFuse).

7. The BIST apparatus of claim 1, wherein the decompression logic includes a linear feedback shift register configured to produce the expanded test patterns based on the test patterns received from the PRPG.

8. An electronic device comprising:
testable circuitry having an input and an output; and
built-in-self-test (BIST) circuitry that includes:
a first memory to store a first set of seed values and a first set of expected signature values that correspond to the first set of seed values;
a second memory to store a second set of seed values and a second set of expected signature values that correspond to the second set of seed values;
a first selector having a first input coupled to the first memory, a second input coupled to the second memory, and an output to output a selected one of a seed value from the first set of seed values or a seed value from the second set of seed values as a selected seed value;

a second selector having a first input coupled to the first memory, a second input coupled to the second memory, and an output to output a selected one of an expected signature value from the first set of signatures values or an expected signature value from the second set of signature values as a selected expected signature value;

a pseudo-random pattern generator (PRPG) to generate test patterns based on the selected seed value and having an output to output the test patterns;

decompression logic having an input to receive the test patterns from the PRPG and an output to output expanded test patterns corresponding to the test patterns to the input of the testable circuitry;

a multiple input shift register (MISR) having an input to receive, from the output of the testable circuitry, a response based on the expanded test patterns, a first output to output a signature value of the response, and a second output;

a masking logic having a first input coupled to the first output of the MISR, a second input coupled to the second output of the MISR, and an output to output a modified signature value that is produced by masking at least a portion of the signature value;

a third selector having a first input to receive the signature value, a second input to receive the modified signature value, and an output to output a selected one of the signature value or the modified signature value as a selected signature; and a comparator having a first input to receive the selected expected signature value, a second input to receive the selected signature value, and an output to output a comparison result of the selected expected signature value to the selected signature value.

9. The electronic device of claim 8, wherein the masking logic includes an XOR logic gate.

10. The electronic device of claim 8, wherein the decompression logic includes a linear feedback shift register configured to produce the expanded test patterns based on the test patterns received from the PRPG.

11. The electronic device of claim 8, wherein:
the first memory includes a memory mapped register file; and
the second memory includes a one-time programmable (OTP) memory.

12. The electronic device of claim 11, wherein the OTP memory includes an electronic fuse device (eFuse).

13. The electronic device of claim 8, wherein the testable circuitry and the BIST circuitry are disposed on a same integrated circuit die.

14. A method for testing a circuit, the method comprising:
selecting a seed value from one of a first set of seed values or a second set of seed values;
using the selected seed value to generate a plurality of test patterns;
expanding the test patterns to obtain a plurality of expanded test patterns;
providing the expanded test patterns to the circuit as test stimulus information;
receiving a response to the expanded test patterns from the circuit;
using a signature analyzer to produce an unmodified signature value based on the received response;
masking a portion of the unmodified signature value to produce a modified signature value;
selecting a signature value as one of the unmodified signature value or the modified signature value;
selecting an expected signature value from one of a first set of expected signature values that corresponds to the first set of seed values or a second set of expanded signature values that corresponds to the second set of seed values;
comparing the selected signature value with the selected expected signature value; and
outputting a result of the comparison of the selected signature value and the selected expected signature value.

15. The method of claim 14, wherein:
the first set of seed values and the first set of expected signature values are stored in a first memory; and
the second set of seed values and the second set of expected signature values are stored in a second memory.

16. The method of claim 15, wherein the first memory includes a memory mapped register file and the second memory includes a one-time programmable (OTP) memory.

17. The method of claim 16, wherein the OTP memory includes an electronic fuse device (eFuse).

18. The method of claim 14, wherein:
the signature analyzer includes a multiple input shift register (MISR); and
masking a portion of the signature value to produce a modified signature value comprises using an XOR logic circuit.

19. The method of claim 14, wherein expanding the test patterns to obtain a plurality of expanded test patterns comprises using a linear feedback shift register.

* * * * *